United States Patent
Sanamreddy et al.

(10) Patent No.: US 12,463,629 B2
(45) Date of Patent: Nov. 4, 2025

(54) HIGH PERFORMANCE PULSE-AMPLITUDE MODULATION (PAM)/NON-RETURN-TO-ZERO (NRZ) TRANSMITTER DRIVER FOR HIGH-SPEED WIRELINE LINKS

(71) Applicant: Intel Corporation, Santa Clara, CA (US)

(72) Inventors: Venkata Reddy Sanamreddy, Bangalore (IN); Adithya Kumar Swaminathan, Chennai (IN); Chakravarti Bheemisetti, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 644 days.

(21) Appl. No.: 17/831,319

(22) Filed: Jun. 2, 2022

(65) Prior Publication Data

US 2023/0396243 A1    Dec. 7, 2023

(51) Int. Cl.
  *H03K 7/02*    (2006.01)
(52) U.S. Cl.
  CPC ..................... *H03K 7/02* (2013.01)

(58) Field of Classification Search
  CPC ........................................... H03K 7/02
  USPC ........................................... 327/108
  See application file for complete search history.

(56) References Cited

U.S. PATENT DOCUMENTS 10,491,436 B1 * 11/2019 Lim ............... H03K 19/017545
2024/0097667 A1 * 3/2024 Wang ..................... H03K 7/02

\* cited by examiner

*Primary Examiner* — Tomi Skibinski
(74) *Attorney, Agent, or Firm* — Schwabe, Williamson & Wyatt, P.C.

(57) ABSTRACT

Embodiments herein relate to a transmitter which can operate in a non-return-to-zero (NRZ) mode or a pulse amplitude modulation (PAM) mode with three or more levels. The transmitter includes a first driver which processes most significant bits and a second driver which processes least significant bits, in the PAM3 mode. In the NRZ mode, the second driver is turned off but resistances in the second driver are used to optimize impedance in the first driver. Switches can be turned on to couple in resistors in the first driver with resistors in the second driver, for pairs of driver slices. The switches are turned off in the PAM3 mode.

20 Claims, 6 Drawing Sheets

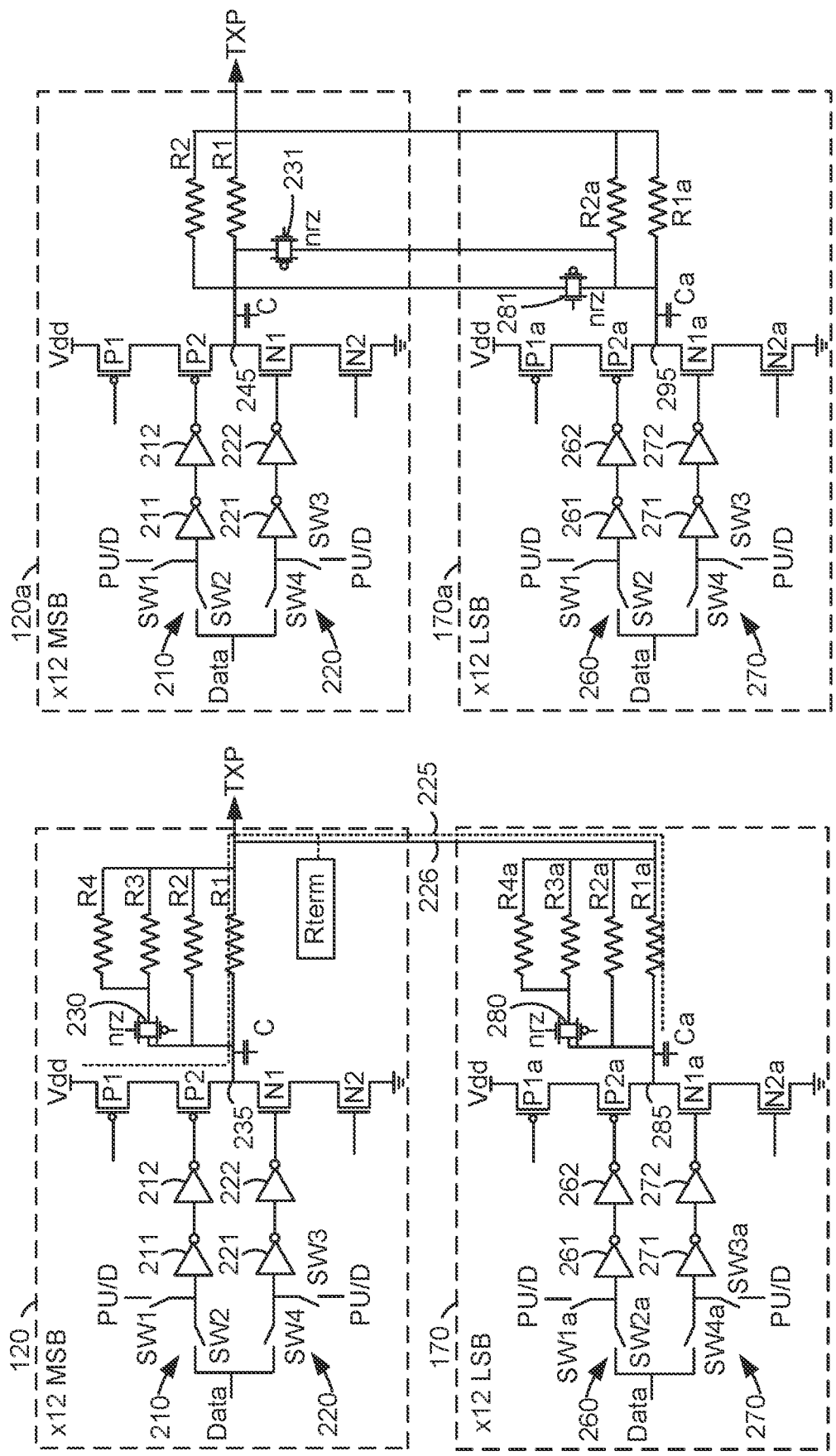

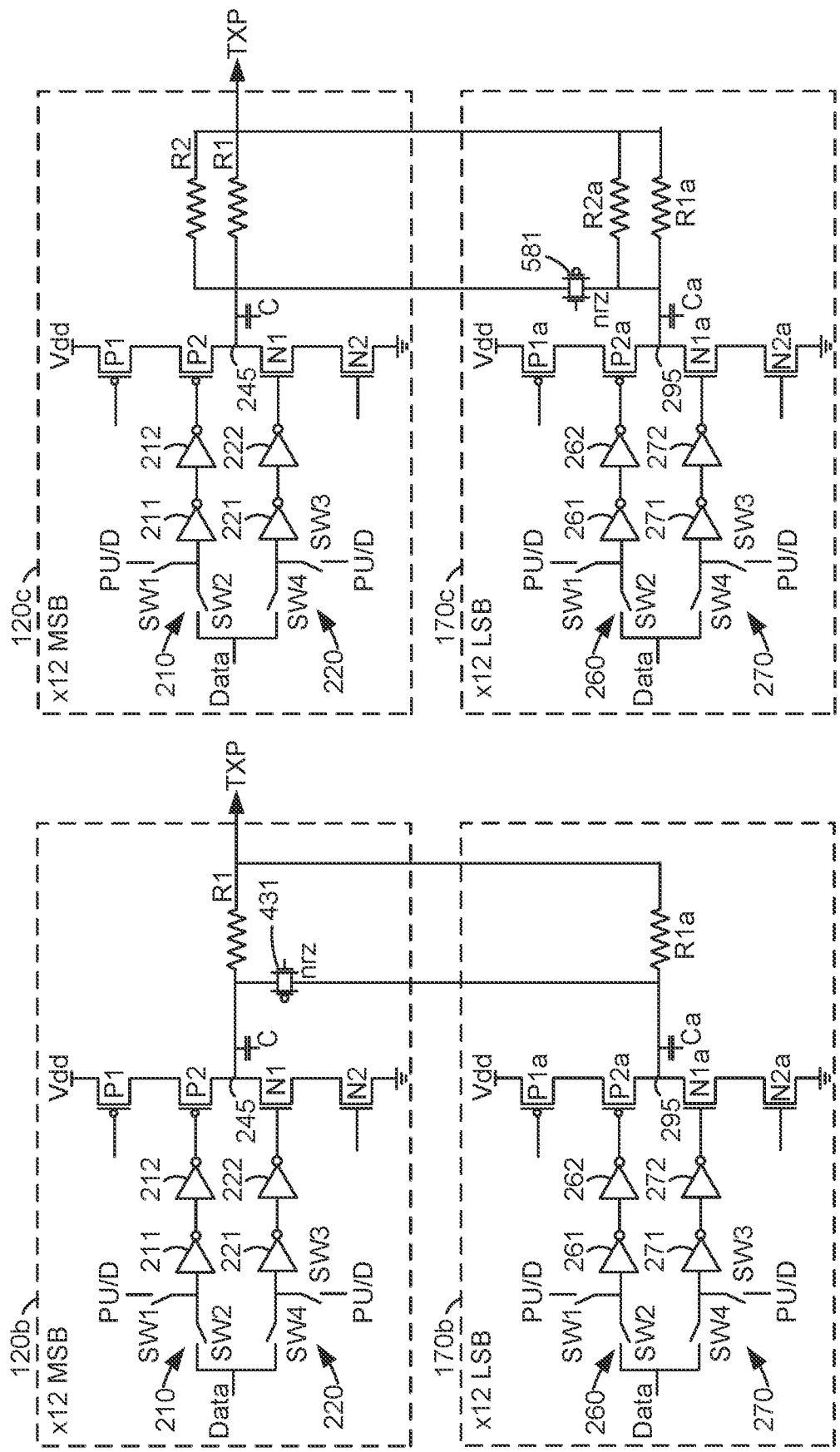

| Performance parameters in NRZ mode at 50 Ω calibration | Comparative x12 MSB | Proposed x12 MSB | Comment |
|---|---|---|---|
| 1) Number of slices powered on | | | |
| 2) Effective Tx pad cap. at mid-calibration code | ~243 fF | ~123 fF | |
| 3) Area for one unit slice | 14.2 μm² | 12.1 μm² | Improved 16% |
| 4) Jitter without ESD load | 275 fs | 77 fs | T-coil not present |
| 5) Jitter with ESD load | 535 fs | 195 fs | T-coil not present |
| 6) Eye height without ESD load | 782 mV | 850 mV | |
| 7) Eye height with ESD load | 735 mV | 805 mV | |
| 8) Differential RL (SDD) at Nyquist frequency (12.8 GHz) | -5.8 dB | -8.7 dB | Improved 2.9 dB |
| 9) Rise/fall times (20% to 80%) | 11.9 ps/13.2 ps | 7.6 ps/7.9 ps | Improved 4.3 ps (50%) |
| 10) Driver power | 6.14 mA | 6.03 mA | Improved by 100 μA |
| 11) Supply voltage | 0.9 V | 0.9 V | |
| 12) Pattern | PRBS7 | PRBS7 | |

Fig. 8

HIGH PERFORMANCE PULSE-AMPLITUDE MODULATION (PAM)/NON-RETURN-TO-ZERO (NRZ) TRANSMITTER DRIVER FOR HIGH-SPEED WIRELINE LINKS

FIELD

The present application generally relates to the field of computing devices having multiple integrated circuits operating in parallel, and more particularly to optimizing the operation of the integrated circuits.

BACKGROUND

Transmitters play a key role in computing devices. In some cases, a goal is to transmit data at the highest rate possible. In other cases, a lower data rate is suitable based on the limitations of a channel or receiver, or based on a desire to reduce power consumption. Some transmitters can operate at multiple data rates depending on the requirements. For lower data rates, a portion of the transmitter may be turned off. However, this can reduce impedance and result in other inefficiencies.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 2 depicts a comparative example implementation of the driver slices 120 and 170 of FIG. 1, in accordance with various embodiments.

FIG. 3 depicts an example implementation of driver slices 120a and 170a, consistent with the driver slices 120 and 170 of FIG. 1, respectively, where resistors R1 and R2 can be coupled to resistors R1a and R2a by transmission gates 231 and 281, in accordance with various embodiments.

FIG. 4 depicts an example implementation of driver slices 120b and 170b, consistent with the driver slices 120 and 170 of FIG. 1, respectively, where a resistor R1 can be coupled to a resistor R1a by a transmission gate 431, in accordance with various embodiments.

FIG. 5 depicts an example implementation of driver slices 130c and 180c, consistent with the driver slices 120 and 170 of FIG. 1, respectively, where resistors R1 and R2 can be coupled to resistors R1a and R2a by a switch 581, in accordance with various embodiments.

FIG. 8 depicts a table of performance parameters for the transmitter 100 of FIG. 1, for the comparative example of the driver slice of FIG. 2 and the proposed example of the driver slice of FIG. 3, in accordance with various embodiments.

DETAILED DESCRIPTION

Figure 1:
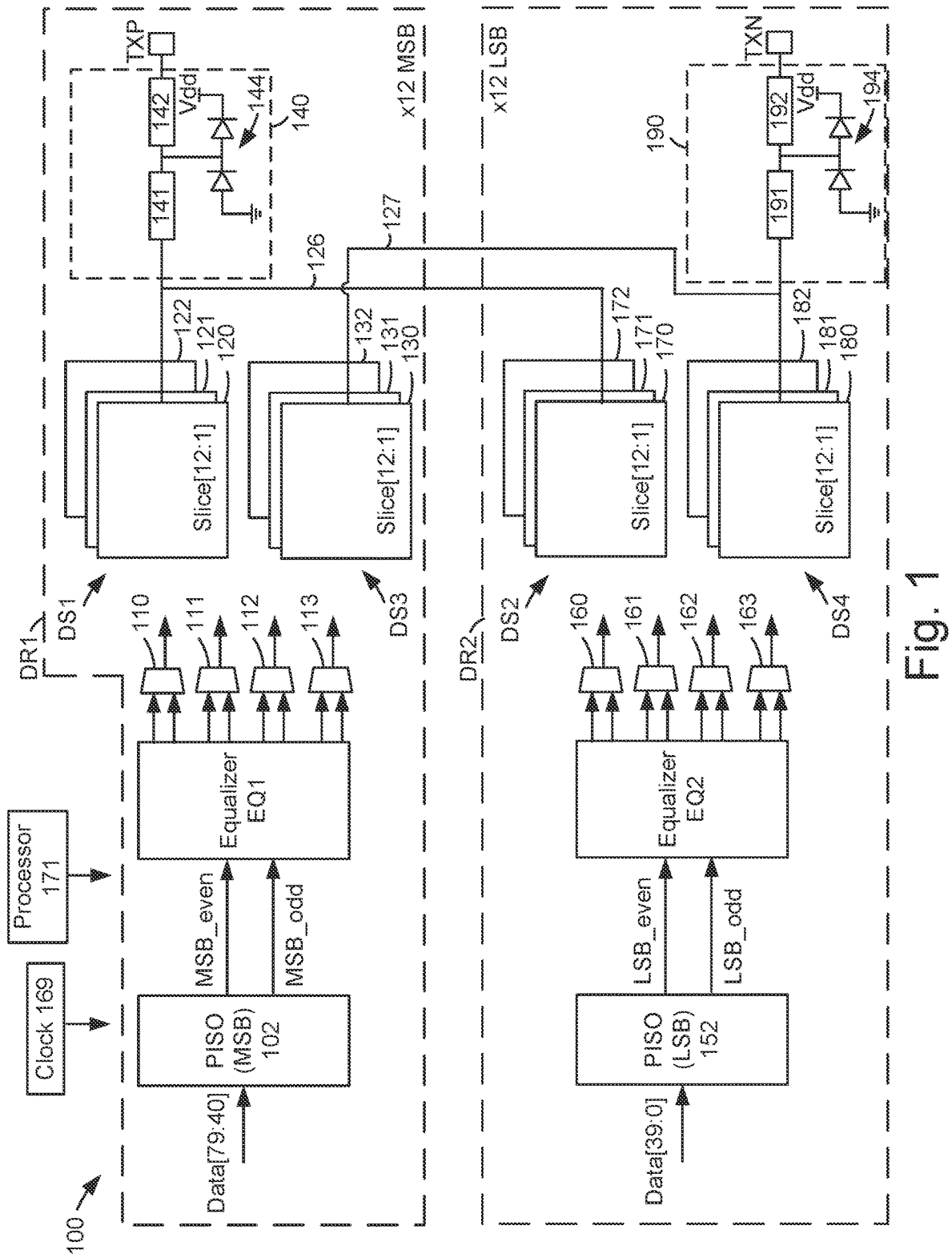
FIG. 1 depicts an example implementation of a transmitter 100 which is operable in a non-return-to-zero mode and a pulse amplitude modulation (PAM) mode with three levels, in accordance with various embodiments.

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The terms "substantially," "close," "approximately," "near," and "about," generally refer to being within +/−10% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B, and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group), a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

The terms "coupled," "communicatively coupled," along with derivatives thereof are used herein. The term "coupled" may mean two or more elements are in direct physical or electrical contact with one another, may mean that two or more elements indirectly contact each other but still cooperate or interact with each other, and/or may mean that one or more other elements are coupled or connected between the elements that are said to be coupled with each other. The term "directly coupled" may mean that two or more elements are in direct contact with one another. The term "communicatively coupled" may mean that two or more elements may be in contact with one another by a means of communication including through a wire or other interconnect connection, through a wireless communication channel or link, and/or the like.

As mentioned at the outset, various challenges are presented in operating transmitters at multiple data rates. One example of such a transmitter operates in a non-return-to-zero (NRZ) mode or a pulse amplitude modulation (PAM) mode with three or more levels. PAM with three levels, for example, is referred to as PAM3. NRZ is the same as PAM with two levels. The transmitter may include a number of driver slices, which are circuits which process bits of the data path. In the PAM mode with multi-level signaling (>2 levels), two data paths are used: one for the most significant bits (MSBs) and another for the least significant bits (LSBs). In the NRZ mode, one option is to duplicate the data on the MSB and LSB data paths. Another option is to enable only the MSB data path while the high-impedance (high Z) LSB data path is power gated, or turned off. This saves significant power, achieving better power efficiency, but a design challenge is to meet a target impedance, such as 50Ω, without degrading performance.

One possible solution is to add extra resistors, such as thin-film resistors (TFRs), in the driver slices on the MSB driver through the control of switches such as transmission gates (TGs). These extra resistors help compensate for the impedance loss from the turned off LSB driver slices. In one possible implementation (see FIG. 2), each driver slice has four resistors and two TGs, for a total of 96 resistors and 48 TGs for an entire source-series terminated (SST) driver implemented using 24 slices. However, this approach has a number of drawbacks. For example, the additional resistors increase the required area of the transmitter. Further, when the LSB driver is power gated, this increases the effective pad capacitance by 2× and hence degrades performance at higher data rates.

The techniques disclosed herein address the above and other issues. In one aspect, a transmitter includes a first, primary driver and a second, auxiliary, driver. In the NRZ mode, the first driver is turned on to process data of a data path while the second driver is turned off, so that the second driver does not process data of a data path. Additionally, the resistors of the driver slices of the first driver are coupled by switches to resistors of the driver slices of the second driver to decrease impedance. In the PAM3 or higher mode, both the first and second drivers are turned on. The first driver processes MSB bits of a data path and the second driver processes LSB bits of the data path. The resistors of the driver slices of the first driver are decoupled from the resistors of the driver slices of the second driver.

In one approach, switches such as transmission gates are turned on (made conductive) to couple the resistors, or turned off (made non-conductive) to decouple the resistors. The driver slices in the first and second drivers can be arranged in pairs so that each pair has one or more switches for coupling and decoupling resistors. One or more resistors of the driver slice of the first driver can be coupled in parallel with, or decoupled from, one or more resistors of the driver slice of the second driver.

In the NRZ mode, the proposed design utilizes the resistors from the LSB driver slices, which are turned off, so that a target impedance can be met without increasing the effective pad capacitance. This improves performance and area use, while avoiding other drawbacks.

These and other features will be apparent in view of the following discussion.

FIG. 1 depicts an example implementation of a transmitter 100 which is operable in a non-return-to-zero mode and a pulse amplitude modulation (PAM) mode with three levels, in accordance with various embodiments. The transmitter is a dual mode or other multi-mode transmitter. The transmitter includes a first driver DR1 and a second driver DR2. The first driver includes a set of driver slices DS1, including driver slices 120, 121, . . . , 122, and a set of driver slices DS3, including driver slices 130, 131, . . . , 132. For example, each set of driver slices can include 12 driver slices, denoted by Slice[12:1]. In the PAM3 or higher mode, the first driver receives MSBs of a data stream while the second driver receives LSBs of the data stream. For example, the first driver may receive 40 bits at a time, denoted by Data[79:40], at a Parallel-in, Serial-out (PISO) shift register 102. The second driver may receive 40 bits at a time, denoted by Data[39:0], at a PISO shift register 152. A data stream may provide 80 bits at a time in this case.

The PISO 102 outputs two streams of data, MSB_even and MSB_odd, to an equalizer EQ1, such as a four-tap equalizing shift register. EQ1 in turn outputs data to four multiplexers 110-113. Data referred to as Pre2Cur_O and Pre2Cur_E (odd and even, respectively) is output on the two inputs of the multiplexer 110. Data referred to as Pre1Cur_O and Pre1Cur_E (odd and even, respectively) is output on the two inputs of the multiplexer 111. Data referred to as Cursor_E and Cursor_O (even and odd, respectively) is output on the two inputs of the multiplexer 112. Data referred to as PostCur_O and PostCur_E (odd and even, respectively) is output on the two inputs of the multiplexer 113. Outputs of the multiplexers 110-113 are Pre2Cur_data, Pre1Cur_data, Cursor_data and Post_data, respectively. These four outputs can be provided to each of the driver slices in DS1 and DS3.

Similarly, the PISO 152 outputs two streams of data, LSB_even and LSB_odd, to an equalizer EQ2, such as a four-tap equalizing shift register. EQ2 in turn outputs data to four multiplexers 160-163. Pre2Cur_O and Pre2Cur_E are output on the two inputs of the multiplexer 160. Pre1Cur_O and Pre1Cur_E (odd and even, respectively) are output on the two inputs of the multiplexer 161. Cursor_E and Cursor_O are output on the two inputs of the multiplexer 162. PostCur_O and PostCur_E are output on the two inputs of the multiplexer 163. Outputs of the multiplexers 160-163 are Pre2Cur_data, Pre1Cur_data, Cursor_data and Post_data, respectively. These four outputs can be provided to each of the driver slices in DS2 and DS4.

The parameters mentioned above are equalization definitions as follows:

MSB_even, MSB_odd→MSB Even(E) and MSB Odd(O) data, respectively;

LSB_even, LSB_odd→LSB Even(E) and Odd(O) data, respectively;

Pre1Cur_O, Pre1Cur_E→First precursor (first future data) odd and even data, respectively;

Pre2Cur_O, Pre2Cur_E→Second precursor (second future data) odd and even data, respectively;

Cursor_E, Cursor_O→cursor (present data) even and odd data, respectively;

Pre2Cur_data, Pre1Cur_data→Second precursor (second future data) and First precursor (first future data), respectively; and Cursor_data and Post_data→Cursor(present) and Post (past) data, respectively.

Each driver slice in DS1 is paired with a respective driver slice in DS2 by a respective path, and each driver slice in DS3 is paired with a respective driver slice in DS4 by a respective path. For example, the driver slice 120 is paired with the driver slice 170 by a path 126, and the driver slice 130 is paired with the driver slice 180 by a path 127. Each pair of slices is further coupled to a transmission pad to output data. For example, the pairs of slices in DS1 and DS2 are coupled to a first transmission pad TXP associated with the first driver, and the pairs of slices in DS3 and DS4 are coupled to a second transmission pad TXN associated with the second driver.

Circuitry 140 and 190 for electrostatic discharge (ESD) protection is provided before the transmission pads TXP and TXN, respectively. For example, the transmission pads may be coupled to interfaces for the transmission of serial data according to the Universal Serial Bus (USB) 4.0 or the Peripheral Component Interconnect (PCiE®) 6 protocols. The circuitry, referred to as a T-coil, protects against ESD from these interfaces.

For example, the circuitry 140 includes inductors 141 and 142, and pairs of diodes 143 and 144. In the pair of diodes 143, one diode is coupled to a power supply at Vdd and the other diode is coupled to ground. This pair of diodes 143 is coupled to output paths of the slices of DS1 and DS2. The pair of diodes 144 is coupled to a point between the inductors. One diode is coupled to Vdd and the other diode is coupled to ground.

Similarly, the circuitry 190 includes inductors 191 and 192, and pairs of diodes 193 and 194. In the pair of diodes 193, one diode is coupled to Vdd and the other diode is coupled to ground. This pair of diodes 193 is coupled to output paths of the slices of DS3 and DS4. The pair of diodes 194 is coupled to a point between the inductors. One diode is coupled to Vdd and the other diode is coupled to ground.

In the NRZ mode of the transmitter, a data signal is output via TXP but not TXN. This data signal has passed through resistors of pairs of driver slices, such as slices 120 and 170, in the first and second drivers, respectively.

In the PAM3 or higher mode of the transmitter, MSB and LSB data signals are output via TXP and TXN, respectively. The MSB data signal has passed through resistors of a driver slice, such as slice 120, in the first driver, and the LSB data signal has passed through resistors of a driver slice, such as slice 180, in the second driver.

A clock 169 may provide a clock signal to the PISO 102, EQ1 and multiplexers 110-113 in DR1, and to the PISO 152, EQ2 and multiplexers 160-163 in DR2. The processor 171 or other control circuit can provide control signals such as nrz which control switches in the driver slices, as discussed further in connection with FIG. 2-5. This control signal is set based on whether the NRZ mode or PAM3 mode is currently active.

Generally, PAM signaling is an attractive solution for high-speed links and requires half the bandwidth compared to NRZ for the same data rate. In fact, the latest USB 4.0 and PCIE 6 protocols require support of both PAM and NRZ to be backward compatible.

The transmitter architecture shown in FIG. 1 includes a parallel-in-serial-out (PISO) circuit, a 4-tap finite impulse response (FIR) equalizer, a high speed serializer 2:1 stage (SRZ) and X12 pre-driver and SST slices each in the MSB and LSB data paths. The impedance of each SST driver slice is calibrated to maintain a specified impedance, e.g., 1200Ω (24 slices*50Ω) and a total effective impedance of, e.g., 50Ω, to match the channel for optimum performance. Each driver slice includes a pMOS pull-up and a nMOS pulldown branch and a series termination resistor (see FIG. 2). In addition, each driver slice contains a calibrated Pcode and Ncode MOS array used for impedance tuning across process, voltage and temperature (PVT) corners.

The transmitter 100 in the PAM mode with multi-level signaling (>2 levels) requires both the MSB and LSB data path, while the same transmitter in the NRZ mode with 2-levels has two choice. A first choice is to use a conventional architecture with data duplication on the MSB and LSB data paths. A second choice is to enable only the MSB data path while power gating the LSB data path. Data duplication is not an attractive solution in terms of power efficiency/Gbps. LSB power gating improves power efficiency/Gbps, but a design challenge is to meet the 50Ω target impedance with only the MSB data path driver slices without degrading performance. Compared to a conventional architecture where the MSB and LSB data paths are both always on in NRZ mode, the proposed architecture achieves a 20-22% power savings by enabling only the MSB data path and power gating the LSB data path.

FIG. 2 depicts a comparative example implementation of the driver slices 120 and 170 of FIG. 1, in accordance with various embodiments. The driver slice 120 receives data (Data) in two branches 210 and 220. The branch 210 includes pull up/down (PU/D) switches SW1 and SW2 and inverters 211 and 212 coupled to the gate of a pMOS transistor P2. The branch 220 includes PU/D switches SW3 and SW4 and inverters 221 and 222 coupled to the gate of an n-type transistor N1. The pull up is to a supply voltage Vdd and the pull down is to ground. P2 and N1 are in a chain of series-connected transistors which also includes a p-type transistor P1, which is coupled to a power supply voltage Vdd, and an nMOS transistor N2, which is coupled to ground. The p-type transistors can be metal-oxide-semiconductor field-effect transistors (pMOS) transistors and the n-type transistors can be nMOS transistors, for example. A data signal at the output node 235 of the driver slice, between P2 and N1, passes through parallel resistors R1 and R2 before reaching TXP. P1 and P2 are in a pull up branch and N1 and N2 are in a pull down branch.

Additionally, a transmission gate 230 can be turned on or off based on a control signal nrz. A transmission gate is one example of any type of switch which can be used. When the transmission gate 230 is turned on, additional resistors R3 and R4 are coupled in parallel with R1 and R2 to decrease impedance. When the transmission gate is turned off, the additional resistors are not used. Generally, impedance (Z) is a measure of the opposition to electrical flow. For a direct current (DC) signal, impedance and resistance are the same, and are defined as the voltage across an element divided by the current (R=V/I). As additional parallel paths are made available by turning on the transmission gate, the current in each path decreases so that the impedance increases.

The driver slice 120 is turned on or active when the active devices P1 and N2 are turned on based on control signals from the processor 171. The active devices P2 and N1 are turned off or off based on data on the respective paths 210 and 220.

Similarly, the driver slice 170 receives data (Data) in two branches 260 and 270. The branch 260 includes PU/D switches SW1a and SW2a and inverters 261 and 262 coupled to the gate of a pMOS transistor P2a. The branch 270 includes PU/D switches SW3a and SW4a and inverters 271 and 272 coupled to the gate of an n-type transistor N1a. P2a and N1a are in a chain of series-connected transistors which also includes P1*a*, which is coupled to a power supply voltage Vdd, and N2*a* which is coupled to ground. In the PAM3 mode, a data signal at the output node 285 of the driver slice, between P2*a* and N1*a*, passes through resistors Ria and R2*a* which are in parallel, before reaching TXP. In the NRZ mode, the transistors P1*a*, P2*a*, N1*a* and N2*a* are turned off so that their voltages are floating. The resistors Ra1-R4*a* are therefore not affected by these transistors and the data paths 260 and 270.

Additionally, a transmission gate 280 or other switch can be turned on or off based on a control signal nrz. When the transmission gate 280 is turned on, additional resistors R3*a* and R4*a* are coupled in parallel with Ria and R2*a* to decrease impedance. When the transmission gate is turned off, the additional resistors are not used.

The capacitors C1 and C1*a* represent parasitic capacitances of the driver slices 120 and 170, respectively.

One or more of the resistors R1-R4 are series termination resistors of the driver slice 120 coupled to a p-type transistor pull-up (P2) and to an n-type transistor pulldown (N1). One or more of the resistors R1*a*-R4*a* are series termination resistors of the driver slice 170 coupled to a p-type transistor pull-up (P2*a*) and to an n-type transistor pulldown (N1*a*).

The driver slice 120 therefore can selectively decrease impedance in the NRZ mode by adding extra resistors R3 and R4 via the transmission gate 230 to compensate for the impedance loss from turning off the LSB driver slices. However, the additional resistors result in an area penalty. Another drawback is that power gating of the LSB driver impacts rise/fall times and jitter performance at higher data rates. Each SST driver slice, controlled by pre-driver logic, controls the driver pMOS and nMOS data switch transistors, either in active or high-impedance mode. Though the LSB driver is in high-impedance mode when turned off, there still exists an impedance path via the resistors and associated parasitic capacitance. This extra resistance-capacitance (RC) path from the LSB high Z slice is in parallel to the resistance termination (Rterm) or load. The total current should flow through the load only, but part of the current (depicted by dotted line 225) shunts through the RC path 226 from the LSB high Z slice, via R1 and R1*a*. This increases the effective pad capacitance by 2× as shown in FIG. 8.

Other drawbacks can include longer settling times due to higher tau (time constant), and worse return loss (RL), jitter inter-symbol interference (ISI), Eye width and Eye height, as shown in FIG. 8.

FIG. 3 depicts an example implementation of driver slices 120*a* and 170*a*, consistent with the driver slices 120 and 170 of FIG. 1, respectively, where resistors R1 and R2 can be coupled to resistors R1*a* and R2*a* by transmission gates 231 and 281, in accordance with various embodiments. This approach advantageously allows the driver slice 120*a* to couple its resistors R1 and R2 to the resistors R1*a* and R2*a* of the paired driver slice 170*a* via transmission gates 231 and 281. This approach provides a switch for each resistor in parallel in the driver slice 120*a*, e.g., two switches for two resistors in parallel. There is accordingly no need for the additional resistors such R3 and R4 in the driver slice 120, or R3*a* and R4*a* in the driver slice 170 of FIG. 2.

When the transmission gates 231 and 281 are turned off, an output data signal at the output node 245 passes through R1 and R2, but not R1*a* and R2*a*, to TXP. R1 and R2 thus provide a first resistance of the driver slice 120*a* as a first driver slice. If each resistor has the same resistance, e.g., R1=R2, the first resistance is R1/2. When the transmission gates 231 and 281 are turned on, the output data signal at the output node 245 passes through R1, R2, R1*a* and R2*a*, to TXP. R1*a* and R2*a* provide a second resistance of the driver slice 170*a* as a second driver slice. If R1*a*=R2*a*, the second resistance is R1*a*/2. The total resistance through which the data signal passes is based on R1, R2, R1*a* and R2*a*. If these resistors are all equal, the total resistance is R1/4. An example value for the resistors is 1.15 kΩ.

In the PAM3 mode, the output data signal at the output node 295 of the driver slice 170*a*, between P2*a* and N1*a*, passes through resistors R1*a* and R2*a*, but not R1 and R2, before reaching TXP.

One or more of the resistors R1 and R2 are series termination resistors of the driver slice 120*a* coupled to a p-type transistor pull-up (P2) and to an n-type transistor pulldown (N1). One or more of the resistors R1*a* and R2*a* are series termination resistors of the driver slice 170*a* coupled to a p-type transistor pull-up (P2*a*) and to an n-type transistor pulldown (N*ia*).

Note that more than two resistors can be provided in parallel in each driver slice.

The proposed design reuses the existing resistors from the LSB path using TGs to connect the resistors between the MSB and LSB paths in NRZ mode only. Each unit slice adds 1 TG and total of 24 TGs for 24-unit SST driver slices. To provide a modular layout design, the TGs can be split between the MSB and LSB slices, one TG per slice. Although, other approaches are possible, such as providing two TGs in one driver slice of a pair. Advantages include avoiding the need to double the number of resistors, reducing parasitic capacitance and improving rise/fall times, return loss (RL), eye width and eye height. Moreover, the proposed driver layout does not require extra area as the TGs are already provided in existing layouts and can be reconfigured as depicted.

FIG. 4 depicts an example implementation of driver slices 120*b* and 170*b*, consistent with the driver slices 120 and 170 of FIG. 1, respectively, where a resistor R1 can be coupled to a resistor Ria by a transmission gate 431, in accordance with various embodiments. In this approach, the driver slice 120*b* includes one resistor, R1, and the driver slice 170*b* includes one resistor, Ria. These resistors are coupled in parallel when a transmission gate 431 is turned on in the NRZ mode and decoupled when the transmission gate 431 is turned off in the PAM3 or higher mode. R1 provides a first resistance and R1*a* provides a second resistance.

R1 is a series termination resistor of the driver slice 120*b* coupled to a p-type transistor pull-up (P2) and to an n-type transistor pulldown (N1). R1*a* is a series termination resistor of the driver slice 170*b* coupled to a p-type transistor pull-up (P2*a*) and to an n-type transistor pulldown (N1*a*).

FIG. 5 depicts an example implementation of driver slices 120*c* and 170*c*, consistent with the driver slices 120 and 170 of FIG. 1, respectively, where resistors R1 and R2 can be coupled to resistors R1*a* and R2*a* by a transmission gate 581, in accordance with various embodiments. In this approach, the driver slice 120*c* includes a plurality of resistors in parallel, e.g., R1 and R2, and the driver slice 170*c* includes a plurality of resistors in parallel, e.g., R1*a* and R2*a*. The plurality of resistors of the driver slice 120*c* are coupled in parallel with the plurality of resistors of the driver slice 127*c* when a transmission gate 581 is turned on in the NRZ mode and decoupled when the transmission gate 581 is turned off in the PAM3 or higher mode. R1 and R2 provide a first resistance and Ria and R2*a* provides a second resistance.

One or more of the resistors R1 and R2 are series termination resistors of the driver slice 120*c* coupled to a p-type transistor pull-up (P2) and to an n-type transistor pulldown (N1). One or more of the resistors Ria and R2*a* are series termination resistors of the driver slice 170c coupled to a p-type transistor pull-up (P2a) and to an n-type transistor pulldown (N1a).

Figure 6:
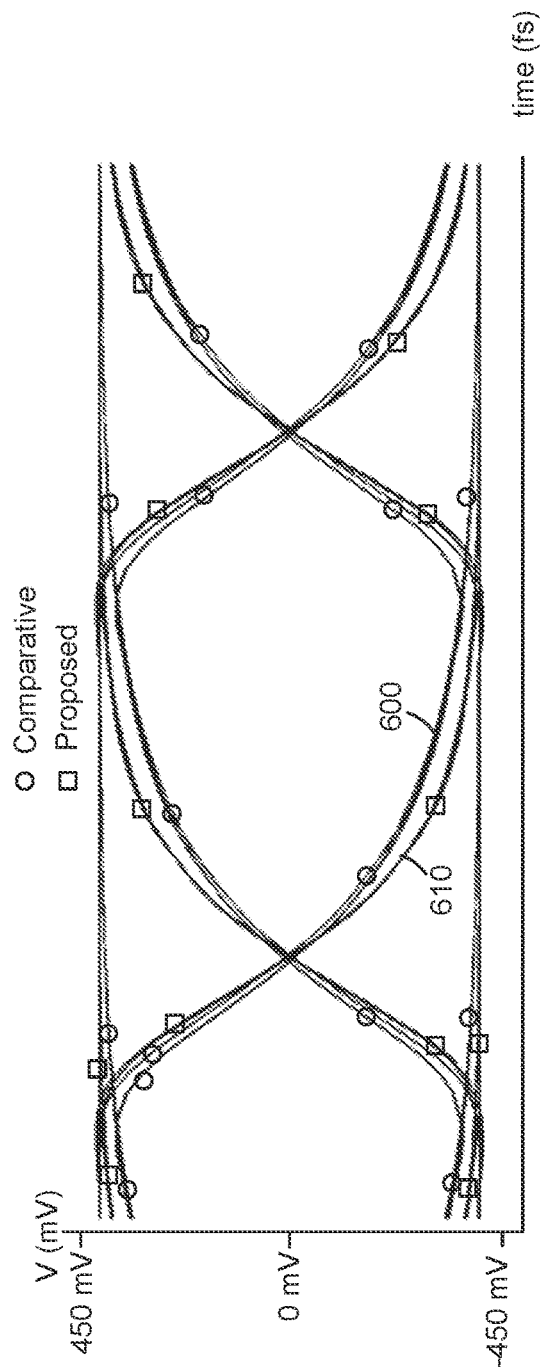
FIG. 6 depicts an example eye diagram for the transmitter 100 of FIG. 1, for the comparative example of the driver slice of FIG. 2 and the proposed example of driver slices of FIG. 3, in accordance with various embodiments.

FIG. 6 depicts an example eye diagram for the transmitter 100 of FIG. 1, for the comparative example of the driver slice of FIG. 2 and the proposed example of driver slices of FIG. 3, in accordance with various embodiments. The horizontal axis depicts time, in femtoseconds (fs) and the vertical axis depicts voltage (V) in millivolts (mV).

An eye diagram provides information regarding the quality of a signal provided by a transmitter. This is a simulated eye diagram based on a random pattern for transmission in the NRZ mode at 25.6 Gbps with ESD protection circuitry added. The lines marked by circles are for the comparative design of FIG. 2 and the lines marked by squares are for the proposed design of FIG. 3. The diagram shows that jitter is reduced substantially, from 535 fs to 195 fs, with the proposed design.

Figure 7:
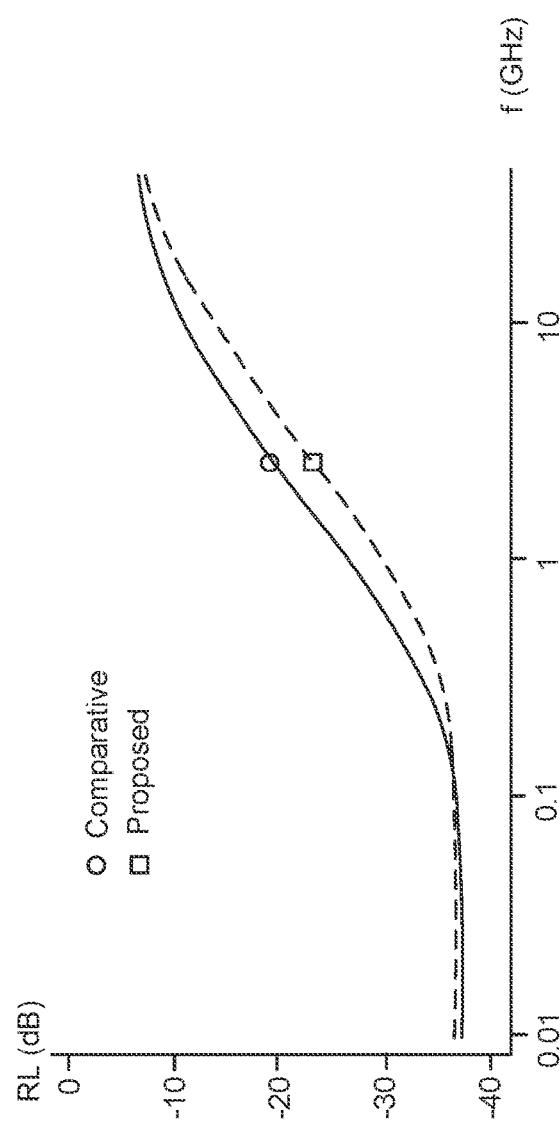
FIG. 7 depicts a plot of return loss for the transmitter 100 of FIG. 1, for the comparative example of the driver slice of FIG. 2 and the proposed example of driver slices of FIG. 3, in accordance with various embodiments.

FIG. 7 depicts a plot of return loss for the transmitter 100 of FIG. 1, for the comparative example of the driver slice of FIG. 2 and the proposed example of driver slices of FIG. 3, in accordance with various embodiments. The horizontal axis depicts frequency (f), in GHz and the vertical axis depicts return loss (RL) in decibels (dB). The example is for transmission in the NRZ mode with ESD protection circuitry added. The solid line, marked by a circle, is for the comparative design of FIG. 2 and the dashed line, marked by a square, is for the proposed design of FIG. 3. The diagram shows that return loss is improved substantially, from −5.8 dB to −8.7 dB, at 12.8 GHz, with the proposed design.

Return loss refers to proportion of a signal that is reflected in a transmission line as a result of an impedance mismatch. The return loss here refers to SDD, a differential-to-differential scattering parameter, where the stimulus and response are differential-mode. The return loss is improved due to a smaller effective transmission pad capacitance. In addition to the NRZ performance benefit, the PAM3 mode also shows better performance, e.g., a capacitance of 200 femtofarad (fF) compared to 120 fF for the same driver power.

FIG. 8 depicts a table of performance parameters for the transmitter 100 of FIG. 1, for the comparative example of the driver slice of FIG. 2 and the proposed example of the driver slice of FIG. 3, in accordance with various embodiments. The performance comparison is based on a 25.6 Gbps NRZ data rate The table has a first column denoting twelve performance parameter in the NRZ mode at a 50Ω calibration, second and third columns denoting a value of the performance parameter for the comparative and proposed cases, respectively, and a fourth column denoting a comment.

Row 1 indicates there are 12 slices power on for both the comparative and proposed cases. Row 2 indicates the effective transmitter (Tx) pad capacitance (cap.) at a mid-calibration code is about 243 fF or 123 fF for the comparative and proposed cases, respectively. Row 3 indicates the area for one unit slice is 14.2 μm² or 12.1 μm² for the comparative and proposed cases, respectively, resulting in a 16% improvement. Row 4 indicates the jitter without ESD load is 275 fs or 77 fs for the comparative and proposed cases, respectively, resulting in a significant improvement. The T-coil is not present. Row 5 indicates the jitter with ESD load is 535 fs or 195 fs for the comparative and proposed cases, respectively, resulting in a significant improvement. The T-coil is not present.

Row 6 indicates the eye height without ESD load is 782 mV or 850 mV for the comparative and proposed cases, respectively, resulting in a significant improvement. Row 7 indicates the eye height with ESD load is 735 mV or 805 mV for the comparative and proposed cases, respectively, resulting in a significant improvement. Row 8 indicates the differential RL (SDD) at a Nyquist frequency of 12.8 GHz is −5.8 dB or −8.7 dB (see FIG. 7) for the comparative and proposed cases, respectively, resulting in a significant improvement of 2.9 dB.

Row 9 indicates rise/fall times (20% to 80%) of 11.9 ps/13.2 ps and 7.6 ps/7.9 ps for the comparative and proposed cases, respectively, resulting in a significant improvement pf 4.3 ps (picoseconds) or about 50%. Row 10 indicates the driver power/current is 6.14 mA (milliamps) or 6.03 mA for the comparative and proposed cases, respectively, resulting in a significant improvement of about 100 μA. Row 11 indicates the supply voltage is 0.9 V for the comparative and proposed cases. Row 12 indicates the data pattern is PRBS7 for the comparative and proposed cases. A Pseudo-Random Binary Sequence (PRBS) is a series of digital 1's and 0's that is statistically random within a sequence length. As an example, a PRBS7 sequence has a word length of 7-bits and will generate a sequence length of 2^7-1 (127) bits, which is repeated indefinitely by a pattern generator.

Figure 9:
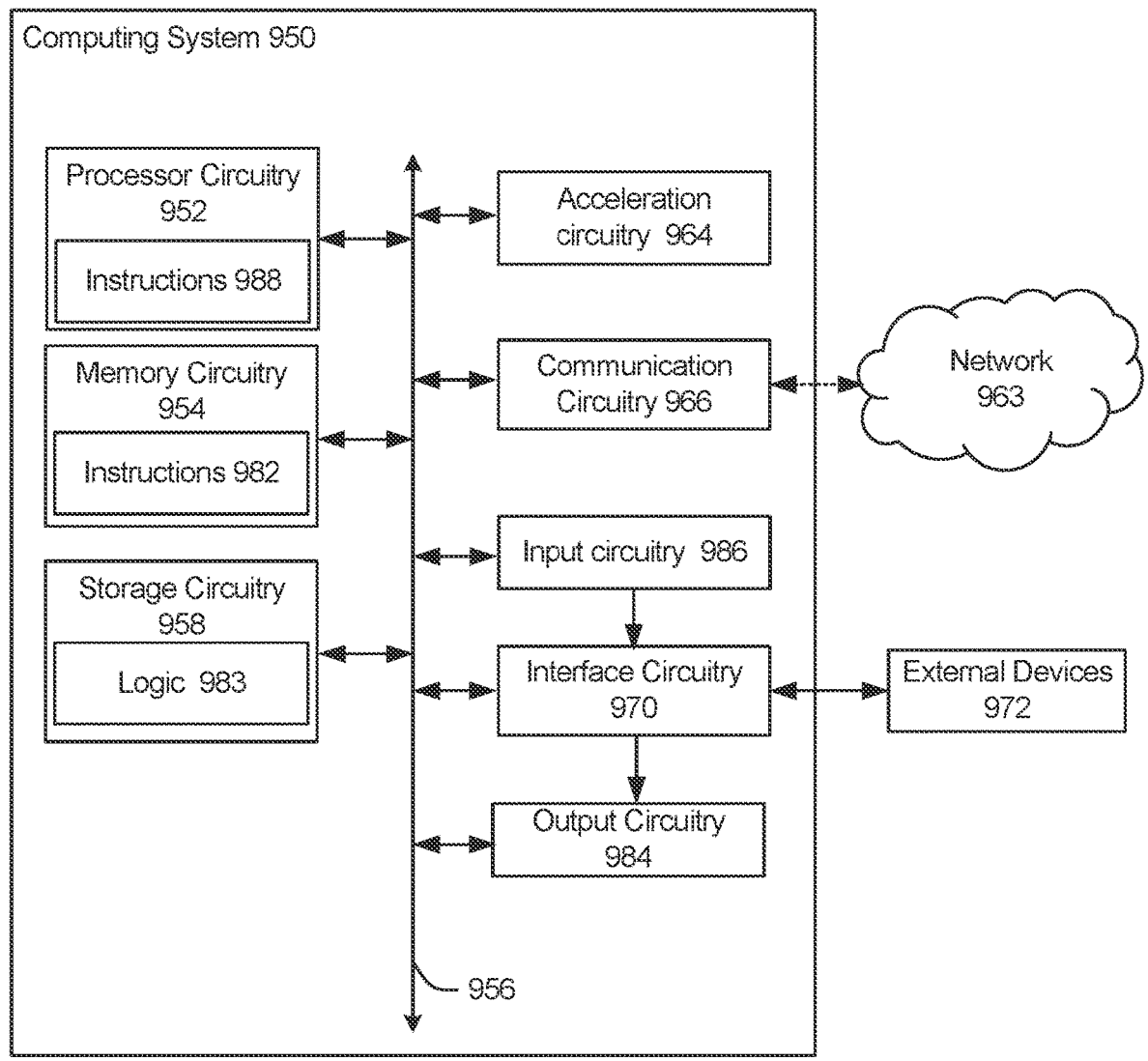
FIG. 9 illustrates an example of components that may be present in a computing system 950 for implementing the techniques (e.g., operations, processes, methods, and methodologies) described herein.

FIG. 9 illustrates an example of components that may be present in a computing system 950 for implementing the techniques (e.g., operations, processes, methods, and methodologies) described herein. The processor circuitry 952 may correspond to the processor 171 of FIG. 1. The communication circuitry 966 may correspond to the transmitter 100 of FIG. 1.

The computing system 950 may include any combinations of the hardware or logical components referenced herein. The components may be implemented as ICs, portions thereof, discrete electronic devices, or other modules, instruction sets, programmable logic or algorithms, hardware, hardware accelerators, software, firmware, or a combination thereof adapted in the computing system 950, or as components otherwise incorporated within a chassis of a larger system. For one embodiment, at least one processor 952 may be packaged together with computational logic 982 and configured to practice aspects of various example embodiments described herein to form a System in Package (SiP) or a System on Chip (SoC).

The system 950 includes processor circuitry in the form of one or more processors 952. The processor circuitry 952 includes circuitry such as, but not limited to one or more processor cores and one or more of cache memory, low drop-out voltage regulators (LDOs), interrupt controllers, serial interfaces such as SPI, I2C or universal programmable serial interface circuit, real time clock (RTC), timer-counters including interval and watchdog timers, general purpose I/O, memory card controllers such as secure digital/multi-media card (SD/MMC) or similar, interfaces, mobile industry processor interface (MIPI) interfaces and Joint Test Access Group (JTAG) test access ports. In some implementations, the processor circuitry 952 may include one or more hardware accelerators (e.g., same or similar to acceleration circuitry 964), which may be microprocessors, programmable processing devices (e.g., FPGA, ASIC, etc.), or the like. The one or more accelerators may include, for example, computer vision and/or deep learning accelerators. In some implementations, the processor circuitry 952 may include on-chip memory circuitry, which may include any suitable volatile and/or non-volatile memory, such as DRAM, SRAM, EPROM, EEPROM, Flash memory, solid-state memory, and/or any other type of memory device technology, such as those discussed herein The processor circuitry 952 may include, for example, one or more processor cores (CPUs), application processors, GPUs, RISC processors, Acorn RISC Machine (ARM) processors, CISC processors, one or more DSPs, one or more FPGAs, one or more PLDs, one or more ASICs, one or more baseband processors, one or more radio-frequency integrated circuits (RFIC), one or more microprocessors or controllers, a multi-core processor, a multithreaded processor, an ultra-low voltage processor, an embedded processor, or any other known processing elements, or any suitable combination thereof. The processors (or cores) 952 may be coupled with or may include memory/storage and may be configured to execute instructions stored in the memory/storage to enable various applications or operating systems to run on the platform 950. The processors (or cores) 952 is configured to operate application software to provide a specific service to a user of the platform 950. In some embodiments, the processor(s) 952 may be a special-purpose processor(s)/controller(s) configured (or configurable) to operate according to the various embodiments herein.

As examples, the processor(s) 952 may include an Intel® Architecture Core™ based processor such as an i3, an i5, an i7, an i9 based processor; an Intel® microcontroller-based processor such as a Quark™, an Atom™, or other MCU-based processor; Pentium® processor(s), Xeon® processor(s), or another such processor available from Intel® Corporation, Santa Clara, California. However, any number other processors may be used, such as one or more of Advanced Micro Devices (AMD) Zen® Architecture such as Ryzen® or EPYC® processor(s), Accelerated Processing Units (APUs), MxGPUs, Epyc® processor(s), or the like; A5-A12 and/or S1-S4 processor(s) from Apple® Inc., Snapdragon™ or Centrig™ processor(s) from Qualcomm® Technologies, Inc., Texas Instruments, Inc.® Open Multimedia Applications Platform (OMAP)™ processor(s); a MIPS-based design from MIPS Technologies, Inc. such as MIPS Warrior M-class, Warrior I-class, and Warrior P-class processors; an ARM-based design licensed from ARM Holdings, Ltd., such as the ARM Cortex-A, Cortex-R, and Cortex-M family of processors; the ThunderX2® provided by Cavium™, Inc.; or the like. In some implementations, the processor(s) 952 may be a part of a system on a chip (SoC), System-in-Package (SiP), a multi-chip package (MCP), and/or the like, in which the processor(s) 952 and other components are formed into a single integrated circuit, or a single package, such as the Edison™ or Galileo™ SoC boards from Intel® Corporation. Other examples of the processor(s) 952 are mentioned elsewhere in the present disclosure.

The system 950 may include or be coupled to acceleration circuitry 964, which may be embodied by one or more AI/IL accelerators, a neural compute stick, neuromorphic hardware, an FPGA, an arrangement of GPUs, one or more SoCs (including programmable SoCs), one or more CPUs, one or more digital signal processors, dedicated ASICs (including programmable ASICs), PLDs such as complex (CPLDs) or high complexity PLDs (HCPLDs), and/or other forms of specialized processors or circuitry designed to accomplish one or more specialized tasks. These tasks may include AI/ML processing (e.g., including training, inferencing, and classification operations), visual data processing, network data processing, object detection, rule analysis, or the like. In FPGA-based implementations, the acceleration circuitry 964 may comprise logic blocks or logic fabric and other interconnected resources that may be programmed (configured) to perform various functions, such as the procedures, methods, functions, etc. of the various embodiments discussed herein. In such implementations, the acceleration circuitry 964 may also include memory cells (e.g., EPROM, EEPROM, flash memory, static memory (e.g., SRAM, anti-fuses, etc.) used to store logic blocks, logic fabric, data, etc. in LUTs and the like.

In some implementations, the processor circuitry 952 and/or acceleration circuitry 964 may include hardware elements specifically tailored for machine learning and/or artificial intelligence (AI) functionality. In these implementations, the processor circuitry 952 and/or acceleration circuitry 964 may be, or may include, an AI engine chip that can run many different kinds of AI instruction sets once loaded with the appropriate weightings and training code. Additionally or alternatively, the processor circuitry 952 and/or acceleration circuitry 964 may be, or may include, AI accelerator(s), which may be one or more of the aforementioned hardware accelerators designed for hardware acceleration of AI applications. As examples, these processor(s) or accelerators may be a cluster of artificial intelligence (AI) GPUs, tensor processing units (TPUs) developed by Google® Inc., Real AI Processors (RAPs™) provided by AlphaICs®, Nervana™ Neural Network Processors (NNPs) provided by Intel® Corp., Intel® Movidius™ Myriad™ X Vision Processing Unit (VPU), NVIDIA® PX™ based GPUs, the NM500 chip provided by General Vision®, Hardware 3 provided by Tesla®, Inc., an Epiphany™ based processor provided by Adapteva®, or the like. In some embodiments, the processor circuitry 952 and/or acceleration circuitry 964 and/or hardware accelerator circuitry may be implemented as AI accelerating co-processor(s), such as the Hexagon DSP provided by Qualcomm®, the PowerVR 2NX Neural Net Accelerator (NNA) provided by Imagination Technologies Limited®, the Neural Engine core within the Apple® A11 or A12 Bionic SoC, the Neural Processing Unit (NPU) within the HiSilicon Kirin provided by Huawei®, and/or the like. In some hardware-based implementations, individual subsystems of system 950 may be operated by the respective AI accelerating co-processor(s), AI GPUs, TPUs, or hardware accelerators (e.g., FPGAs, ASICs, DSPs, SoCs, etc.), etc., that are configured with appropriate logic blocks, bit stream(s), etc. to perform their respective functions.

The system 950 also includes system memory 954. Any number of memory devices may be used to provide for a given amount of system memory. As examples, the memory 954 may be, or include, volatile memory such as random access memory (RAM), static RAM (SRAM), dynamic RAM (DRAM), synchronous DRAM (SDRAM), RAMBUS® Dynamic Random Access Memory (RDRAM®), and/or any other desired type of volatile memory device. Additionally or alternatively, the memory 954 may be, or include, non-volatile memory such as read-only memory (ROM), erasable programmable ROM (EPROM), electrically erasable programmable (EEPROM), flash memory, non-volatile RAM, ferroelectric RAM, phase-change memory (PCM), flash memory, and/or any other desired type of non-volatile memory device. Access to the memory 954 is controlled by a memory controller. The individual memory devices may be of any number of different package types such as single die package (SDP), dual die package (DDP) or quad die package (Q17P). Any number of other memory implementations may be used, such as dual inline memory modules (DIMMs) of different varieties including but not limited to microDIMMs or MiniDIMMs. The memory circuitry may be a memory device to store instructions, where a processor is to execute the instructions to perform the functions described herein.

Storage circuitry 958 provides persistent storage of information such as data, applications, operating systems and so forth. In an example, the storage 958 may be implemented via a solid-state disk drive (SSDD) and/or high-speed electrically erasable memory (commonly referred to as "flash memory"). Other devices that may be used for the storage 958 include flash memory cards, such as SD cards, microSD cards, XD picture cards, and the like, and USB flash drives. In an example, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, phase change RAM (PRAM), resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a Domain Wall (DW) and Spin Orbit Transfer (SOT) based device, a thyristor based memory device, a hard disk drive (HDD), micro HDD, of a combination thereof, and/or any other memory. The memory circuitry 954 and/or storage circuitry 958 may also incorporate three-dimensional (3D) cross-point (XPOINT) memories from Intel® and Micron®.

The memory circuitry 954 and/or storage circuitry 958 is/are configured to store computational logic 983 in the form of software, firmware, microcode, or hardware-level instructions to implement the techniques described herein. The computational logic 983 may be employed to store working copies and/or permanent copies of programming instructions, or data to create the programming instructions, for the operation of various components of system 950 (e.g., drivers, libraries, application programming interfaces (APIs), etc.), an operating system of system 950, one or more applications, and/or for carrying out the embodiments discussed herein. The computational logic 983 may be stored or loaded into memory circuitry 954 as instructions 982, or data to create the instructions 982, which are then accessed for execution by the processor circuitry 952 to carry out the functions described herein. The processor circuitry 952 and/or the acceleration circuitry 964 accesses the memory circuitry 954 and/or the storage circuitry 958 over the interconnect (IX) 956. The instructions 982 direct the processor circuitry 952 to perform a specific sequence or flow of actions, for example, as described with respect to flowchart(s) and block diagram(s) of operations and functionality depicted previously. The various elements may be implemented by assembler instructions supported by processor circuitry 952 or high-level languages that may be compiled into instructions 988, or data to create the instructions 988, to be executed by the processor circuitry 952. The permanent copy of the programming instructions may be placed into persistent storage devices of storage circuitry 958 in the factory or in the field through, for example, a distribution medium (not shown), through a communication interface (e.g., from a distribution server (not shown)), over-the-air (OTA), or any combination thereof.

The IX 956 couples the processor 952 to communication circuitry 966 for communications with other devices, such as a remote server (not shown) and the like. The communication circuitry 966 is a hardware element, or collection of hardware elements, used to communicate over one or more networks 963 and/or with other devices. In one example, communication circuitry 966 is, or includes, transceiver circuitry configured to enable wireless communications using any number of frequencies and protocols such as, for example, the Institute of Electrical and Electronics Engineers (IEEE) 802.11 (and/or variants thereof), IEEE 802.23.4, Bluetooth® and/or Bluetooth® low energy (BLE), ZigBee®, LoRaWAN™ (Long Range Wide Area Network), a cellular protocol such as 3GPP LTE and/or Fifth Generation (5G)/New Radio (NR), and/or the like. Additionally or alternatively, communication circuitry 966 is, or includes, one or more network interface controllers (NICs) to enable wired communication using, for example, an Ethernet connection, Controller Area Network (CAN), Local Interconnect Network (LIN), DeviceNet, ControlNet, Data Highway+, or PROFINET, among many others.

The IX 956 also couples the processor 952 to interface circuitry 970 that is used to connect system 950 with one or more external devices 972. The external devices 972 may include, for example, sensors, actuators, positioning circuitry (e.g., global navigation satellite system (GNSS)/ Global Positioning (System (GPS) circuitry), client devices, servers, network appliances (e.g., switches, hubs, routers, etc.), integrated photonics devices (e.g., optical neural network (ONN) integrated circuit (IC) and/or the like), and/or other like devices.

In some optional examples, various input/output (I/O) devices may be present within or connected to, the system 950, which are referred to as input circuitry 986 and output circuitry 984 in FIG. 9. The input circuitry 986 and output circuitry 984 include one or more user interfaces designed to enable user interaction with the platform 950 and/or peripheral component interfaces designed to enable peripheral component interaction with the platform 950. Input circuitry 986 may include any physical or virtual means for accepting an input including, inter alia, one or more physical or virtual buttons (e.g., a reset button), a physical keyboard, keypad, mouse, touchpad, touchscreen, microphones, scanner, headset, and/or the like. The output circuitry 984 may be included to show information or otherwise convey information, such as sensor readings, actuator position(s), or other like information. Data and/or graphics may be displayed on one or more user interface components of the output circuitry 984. Output circuitry 984 may include any number and/or combinations of audio or visual display, including, inter alia, one or more simple visual outputs/indicators (e.g., binary status indicators (e.g., light emitting diodes (LEDs)) and multi-character visual outputs, or more complex outputs such as display devices or touchscreens (e.g., Liquid Crystal Displays (LCD), LED displays, quantum dot displays, projectors, etc.), with the output of characters, graphics, multimedia objects, and the like being generated or produced from the operation of the platform 950. The output circuitry 984 may also include speakers and/or other audio emitting devices, printer(s), and/or the like. Additionally or alternatively, sensor(s) may be used as the input circuitry 984 (e.g., an image capture device, motion capture device, or the like) and one or more actuators may be used as the output device circuitry 984 (e.g., an actuator to provide haptic feedback or the like). Peripheral component interfaces may include, but are not limited to, a non-volatile memory port, a USB port, an audio jack, a power supply interface, etc. In some embodiments, a display or console hardware, in the context of the present system, may be used to provide output and receive input of an edge computing system; to manage components or services of an edge computing system; identify a state of an edge computing component or service; or to conduct any other number of management or administration functions or service use cases.

The components of the system 950 may communicate over the IX 956. The IX 956 may include any number of technologies, including ISA, extended ISA, I2C, SPI, point-to-point interfaces, power management bus (PMBus), PCI, PCIe, PCIx, Intel® UPI, Intel® Accelerator Link, Intel® CXL, CAPI, OpenCAPI, Intel® QPI, UPI, Intel® OPA IX, RapidIO™ system IXs, CCIX, Gen-Z Consortium IXs, a HyperTransport interconnect, NVLink provided by NVIDIA®, a Time-Trigger Protocol (TTP) system, a FlexRay system, PROFIBUS, and/or any number of other IX technologies. The IX 956 may be a proprietary bus, for example, used in a SoC based system.

The number, capability, and/or capacity of the elements of system 950 may vary, depending on whether computing system 950 is used as a stationary computing device (e.g., a server computer in a data center, a workstation, a desktop computer, etc.) or a mobile computing device (e.g., a smartphone, tablet computing device, laptop computer, game console, IoT device, etc.). In various implementations, the computing device system 950 may comprise one or more components of a data center, a desktop computer, a workstation, a laptop, a smartphone, a tablet, a digital camera, a smart appliance, a smart home hub, a network appliance, and/or any other device/system that processes data.

The techniques described herein can be performed partially or wholly by software or other instructions provided in a machine-readable storage medium (e.g., memory). The software is stored as processor-executable instructions (e.g., instructions to implement any other processes discussed herein). Instructions associated with the flowchart (and/or various embodiments) and executed to implement embodiments of the disclosed subject matter may be implemented as part of an operating system or a specific application, component, program, object, module, routine, or other sequence of instructions or organization of sequences of instructions.

The storage medium can be a tangible machine readable medium such as read only memory (ROM), random access memory (RAM), flash memory devices, floppy and other removable disks, magnetic storage media, optical storage media (e.g., Compact Disk Read-Only Memory (CD ROMS), Digital Versatile Disks (DVDs)), among others.

The storage medium may be included, e.g., in a communication device, a computing device, a network device, a personal digital assistant, a manufacturing tool, a mobile communication device, a cellular phone, a notebook computer, a tablet, a game console, a set top box, an embedded system, a TV (television), or a personal desktop computer.

Some non-limiting examples of various embodiments are presented below.

Example 1 includes an apparatus, comprising: a first driver comprising a first set of driver slices; a second driver comprising a second set of driver slices, wherein each driver slice in the first set of driver slices is paired with a corresponding paired driver slice in the second set of driver slices by one or more respective switches; and a control circuit, wherein for each pair of driver slices: in a non-return-to-zero (NRZ) mode, the control circuit is to turn on the one or more respective switches to couple a first resistance of the driver slice of the first set of driver slices to a second resistance in the paired driver slice of the second set of driver slices; and in a pulse amplitude modulation (PAM) mode with N=3 or more levels, the control circuit is to turn off the one or more respective switches to decouple the first resistance of the driver slice of the first set of driver slices from the second resistance in the paired driver slice of the second set of driver slices.

Example 2 includes the apparatus of Example 1, wherein: in the NRZ mode, the control circuit is to turn on the first set of driver slices and turn off the second set of driver slices; and in the PAM mode, the control circuit is to turn on the first set of driver slices to process most significant bits (MSBs) of a data stream and turn on the second set of driver slices to process least significant bits (LSBs) of the data stream.

Example 3 includes the apparatus of Example 1 or 2, wherein: for each pair of driver slices, the one or more respective switches comprise a first switch in the driver slice of the first set of driver slices and a second switch in the paired driver slice of the second set of driver slices.

Example 4 includes the apparatus of any of Examples 1-3, wherein: for each pair of driver slices, the first resistance of the driver slice of the first set of driver slices comprises a series termination resistor coupled to a p-type transistor pull-up and to an n-type transistor pulldown, and the second resistance in the paired driver slice of the second set of driver slices comprises a series termination resistor coupled to a p-type transistor pull-up and to an n-type transistor pulldown.

Example 5 includes the apparatus of any of Examples 1-4, wherein: each pair of driver slices is coupled to a transmission pad of the first driver.

Example 6 includes the apparatus of Example 5, wherein: for each pair of driver slices, an output data signal of the driver slice of the first set of driver slices is passed to the transmission pad through the first resistance but not the second resistance in the PAM mode, and through first and second resistances in the NRZ mode.

Example 7 includes the apparatus of any of Examples 1-6, wherein: for each pair of driver slices, the first resistance comprises one or more resistors, and the second resistance comprises one or more resistors, and in the NRZ mode, the one or more resistors of the first resistance are coupled in parallel with the one or more resistors of the second resistance.

Example 8 includes the apparatus of any of Examples 1-7, wherein: for each pair of driver slices, the first resistance comprises a plurality of resistors coupled in parallel, and the second resistance comprises a plurality of resistors coupled in parallel, and in the NRZ mode, the plurality of resistors of the first resistance are coupled in parallel with the plurality of resistors of the second resistance.

Example 9 includes the apparatus of Example 8, wherein: for each pair of driver slices, the one or more respective switches comprise a transmission gate for each resistor in the plurality of resistors of the first resistance.

Example 10 includes the apparatus of any of Examples 1-9, wherein: the first driver comprises a respective equalizer coupled to the first driver; and the second driver comprises a respective equalizer coupled to the second driver.

Example 11 includes an apparatus, comprising: a first driver comprising first and third sets of driver slices; a second driver comprising second and fourth sets of driver slices; wherein each driver slice in the first set of driver slices is paired with a corresponding paired driver slice in the second set of driver slices by one or more respective switches, and each driver slice in the third set of driver slices is paired with a corresponding paired driver slice in the fourth set of driver slices by one or more respective switches; and a control circuit; wherein for each pair of driver slices in the first and second sets of driver slices: in a non-return-to-zero (NRZ) mode, the control circuit is to turn on the one or more respective switches to couple a first resistance of the driver slice of the first set of driver slices to a second resistance in the paired driver slice of the second set of driver slices; in a pulse amplitude modulation (PAM) mode with N=3 or more levels, the control circuit is to turn off the one or more respective switches to decouple the first resistance of the driver slice of the first set of driver slices from the second resistance in the paired driver slice of the second set of driver slices; and wherein for each pair of driver slice in the third and fourth sets of driver slices: in the NRZ mode, the control circuit is to turn on the one or more respective switches to couple a third resistance of the driver slice of the third set of driver slices to a fourth resistance in the paired driver slice of the fourth set of driver slices; and in the PAM mode, the control circuit is to turn off the one or more respective switches to decouple the third resistance of the driver slice of the third set of driver slices from the fourth resistance in the paired driver slice of the fourth set of driver slices.

Example 12 includes the apparatus of Example 11, wherein: the first driver comprises a respective equalizer coupled to the first and third sets of driver slices; and the second driver comprises a respective equalizer coupled to the second and fourth sets of driver slices.

Example 13 includes the apparatus of Examples 11 or 12, wherein: in the NRZ mode, the control circuit is to turn on the first and third sets of driver slices and turn off the second and fourth sets of driver slices; and in the PAM mode, the control circuit is to turn on the first and third sets of driver slices to process most significant bits (MSBs) of a data stream and turn on the second and fourth sets of driver slices to process least significant bits (LSBs) of the data stream.

Example 14 includes the apparatus of any of Examples 11-13, wherein: the first and second sets of driver slices are coupled to a first transmission pad of the first driver; and the third and fourth sets of driver slices are coupled to a second transmission pad of the second driver.

Example 15 includes the apparatus Example 14, wherein: for each pair of driver slices of the first and second sets of driver slices, an output data signal of the driver slice of the first set of driver slices is passed to the first transmission pad through the first resistance but not the second resistance in the PAM mode, and through the first and second resistances in the NRZ mode.

Example 16 includes the apparatus of Example 14 or 15, wherein: for each pair of driver slices of the third and fourth sets of driver slices, an output data signal of the driver slice of the third set of driver slices is passed to the second transmission pad through the third resistance but not the fourth resistance in the PAM mode, and through the third and fourth resistances in the NRZ mode.

Example 17 includes an apparatus, comprising: a memory device to store instructions; and a processor to execute the instructions to: in a non-return-to-zero (NRZ) mode, turn on a first driver, turn off a second driver, and turn on one or more respective switches to pass a data signal to a transmission pad of the first driver via a first resistance of the first driver and a second resistance of the second driver while the second driver is turned off, and in a pulse amplitude modulation (PAM) mode with N=3 or more levels, turn on the first and second drivers, and turn off the one or more respective switches to decouple the first resistance from the second resistance, to pass most significant bits (MSBs) of a data stream to the first transmission pad via the first resistance but not the second resistance.

Example 18 includes the apparatus Example 17, wherein: the first resistance comprises one or more resistors; the second resistance comprises one or more resistors; and in the NRZ mode, the processor is to turn on the one or more respective switches to couple the one or more resistors of the first resistance in parallel with the one or more resistors of the second resistance.

Example 19 includes the apparatus of Example 17 or 18, wherein: the first driver comprises a first set of driver slices; and the second driver comprises a second set of driver slices; and a driver slice in the first set of driver slices is paired with a corresponding paired driver slice in the second set of driver slices by the one or more respective switches.

Example 20 includes the apparatus of Example 19, wherein: to turn on the first and second drivers in the PAM mode, the processor is to turn on one or more active devices of the driver slice in the first set of driver slices and one or more active devices of the paired driver slice in the second set of driver slices; and to turn off the second driver, the processor is to turn off the one or more active devices of the paired driver slice in the second set of driver slices.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus, comprising:
   a first driver comprising a first set of driver slices;
   a second driver comprising a second set of driver slices, wherein each driver slice in the first set of driver slices is paired with a corresponding paired driver slice in the second set of driver slices by one or more respective switches; and
   a control circuit, wherein for each pair of driver slices:
      in a non-return-to-zero (NRZ) mode, the control circuit is to turn on the one or more respective switches to couple a first resistance of the driver slice of the first set of driver slices to a second resistance in the paired driver slice of the second set of driver slices; and
      in a pulse amplitude modulation (PAM) mode with N=3 or more levels, the control circuit is to turn off the one or more respective switches to decouple the first resistance of the driver slice of the first set of driver slices from the second resistance in the paired driver slice of the second set of driver slices.

2. The apparatus of claim 1, wherein:
   in the NRZ mode, the control circuit is to turn on the first set of driver slices and turn off the second set of driver slices; and
   in the PAM mode, the control circuit is to turn on the first set of driver slices to process most significant bits (MSBs) of a data stream and turn on the second set of driver slices to process least significant bits (LSBs) of the data stream.

3. The apparatus of claim 1, wherein:
   for each pair of driver slices, the one or more respective switches comprise a first switch in the driver slice of the first set of driver slices and a second switch in the paired driver slice of the second set of driver slices.

4. The apparatus of claim 1, wherein:
   for each pair of driver slices, the first resistance of the driver slice of the first set of driver slices comprises a series termination resistor coupled to a p-type transistor pull-up and to an n-type transistor pulldown, and the second resistance in the paired driver slice of the second set of driver slices comprises a series termination resistor coupled to a p-type transistor pull-up and to an n-type transistor pulldown.

5. The apparatus of claim 1, wherein:
   each pair of driver slices is coupled to a transmission pad of the first driver.

6. The apparatus of claim 5, wherein:
   for each pair of driver slices, an output data signal of the driver slice of the first set of driver slices is passed to the transmission pad through the first resistance but not the second resistance in the PAM mode, and through first and second resistances in the NRZ mode.

7. The apparatus of claim 1, wherein:
   for each pair of driver slices, the first resistance comprises one or more resistors, and the second resistance comprises one or more resistors, and in the NRZ mode, the one or more resistors of the first resistance are coupled in parallel with the one or more resistors of the second resistance.

8. The apparatus of claim 1, wherein:
   for each pair of driver slices, the first resistance comprises a plurality of resistors coupled in parallel, and the second resistance comprises a plurality of resistors coupled in parallel, and in the NRZ mode, the plurality of resistors of the first resistance are coupled in parallel with the plurality of resistors of the second resistance.

9. The apparatus of claim 8, wherein:
   for each pair of driver slices, the one or more respective switches comprise a transmission gate for each resistor in the plurality of resistors of the first resistance.

10. The apparatus of claim 1, wherein:
    the first driver comprises a respective equalizer coupled to the first driver; and
    the second driver comprises a respective equalizer coupled to the second driver.

11. An apparatus, comprising:
    a first driver comprising first and third sets of driver slices;
    a second driver comprising second and fourth sets of driver slices;
    wherein each driver slice in the first set of driver slices is paired with a corresponding paired driver slice in the second set of driver slices by one or more respective switches, and each driver slice in the third set of driver slices is paired with a corresponding paired driver slice in the fourth set of driver slices by one or more respective switches; and
    a control circuit;
    wherein for each pair of driver slices in the first and second sets of driver slices:
       in a non-return-to-zero (NRZ) mode, the control circuit is to turn on the one or more respective switches to couple a first resistance of the driver slice of the first set of driver slices to a second resistance in the paired driver slice of the second set of driver slices;
       in a pulse amplitude modulation (PAM) mode with N=3 or more levels, the control circuit is to turn off the one or more respective switches to decouple the first resistance of the driver slice of the first set of driver slices from the second resistance in the paired driver slice of the second set of driver slices; and
    wherein for each pair of driver slice in the third and fourth sets of driver slices:
       in the NRZ mode, the control circuit is to turn on the one or more respective switches to couple a third resistance of the driver slice of the third set of driver slices to a fourth resistance in the paired driver slice of the fourth set of driver slices; and
       in the PAM mode, the control circuit is to turn off the one or more respective switches to decouple the third resistance of the driver slice of the third set of driver slices from the fourth resistance in the paired driver slice of the fourth set of driver slices.

12. The apparatus of claim 11, wherein:
    the first driver comprises a respective equalizer coupled to the first and third sets of driver slices; and
    the second driver comprises a respective equalizer coupled to the second and fourth sets of driver slices.

13. The apparatus of claim 11, wherein:
    in the NRZ mode, the control circuit is to turn on the first and third sets of driver slices and turn off the second and fourth sets of driver slices; and
    in the PAM mode, the control circuit is to turn on the first and third sets of driver slices to process most significant bits (MSBs) of a data stream and turn on the second and fourth sets of driver slices to process least significant bits (LSBs) of the data stream.

14. The apparatus of claim 11, wherein:
the first and second sets of driver slices are coupled to a first transmission pad of the first driver; and
the third and fourth sets of driver slices are coupled to a second transmission pad of the second driver.

15. The apparatus of claim 14, wherein:
for each pair of driver slices of the first and second sets of driver slices, an output data signal of the driver slice of the first set of driver slices is passed to the first transmission pad through the first resistance but not the second resistance in the PAM mode, and through the first and second resistances in the NRZ mode.

16. The apparatus of claim 14, wherein:
for each pair of driver slices of the third and fourth sets of driver slices, an output data signal of the driver slice of the third set of driver slices is passed to the second transmission pad through the third resistance but not the fourth resistance in the PAM mode, and through the third and fourth resistances in the NRZ mode.

17. An apparatus, comprising:
a memory device to store instructions; and
a processor to execute the instructions to:
   in a non-return-to-zero (NRZ) mode, turn on a first driver, turn off a second driver, and turn on one or more respective switches to pass a data signal to a transmission pad of the first driver via a first resistance of the first driver and a second resistance of the second driver while the second driver is turned off, and
   in a pulse amplitude modulation (PAM) mode with N=3 or more levels, turn on the first and second drivers, and turn off the one or more respective switches to decouple the first resistance from the second resistance, to pass most significant bits (MSBs) of a data stream to the first transmission pad via the first resistance but not the second resistance.

18. The apparatus of claim 17, wherein:
the first resistance comprises one or more resistors;
the second resistance comprises one or more resistors; and
in the NRZ mode, the processor is to turn on the one or more respective switches to couple the one or more resistors of the first resistance in parallel with the one or more resistors of the second resistance.

19. The apparatus of claim 17, wherein:
the first driver comprises a first set of driver slices;
the second driver comprises a second set of driver slices; and
a driver slice in the first set of driver slices is paired with a corresponding paired driver slice in the second set of driver slices by the one or more respective switches.

20. The apparatus of claim 19, wherein:
to turn on the first and second drivers in the PAM mode, the processor is to turn on one or more active devices of the driver slice in the first set of driver slices and one or more active devices of the paired driver slice in the second set of driver slices; and
to turn off the second driver, the processor is to turn off the one or more active devices of the paired driver slice in the second set of driver slices.

* * * * *